United States Patent [19]

Evans

[11] Patent Number: 4,999,587
[45] Date of Patent: Mar. 12, 1991

[54] WAVEGUIDE OSCILLATOR TUNABLE THROUGH INTEGRATED VARACTOR DIODE AND COUPLING PROBE

[75] Inventor: David H. Evans, Crawley, United Kingdom

[73] Assignee: U.S. Philips Corp., New York, N.Y.

[21] Appl. No.: 460,411

[22] Filed: Jan. 3, 1990

[30] Foreign Application Priority Data

Jan. 20, 1989 [GB] United Kingdom ............... 8901290

[51] Int. Cl.[5] ........................ H03B 7/14; H03B 9/14
[52] U.S. Cl. .................... 331/107 DP; 331/107 SL;
                                        331/107 G; 331/177 V
[58] Field of Search .......... 331/96, 107 DP, 107 SL,
                                    331/107 G, 117 D, 177 V

[56] References Cited

U.S. PATENT DOCUMENTS

| 3,878,480 | 4/1975 | Hulderman et al. .... 331/107 DP X |
| 3,882,419 | 5/1975 | Swartz et al. ........................ 331/96 |
| 4,222,014 | 9/1980 | Ondria .......................... 331/107 DP |

FOREIGN PATENT DOCUMENTS 0284485  9/1988  European Pat. Off. .
1238956  7/1971  United Kingdom .
1409836 10/1975  United Kingdom .
2133240  7/1984  United Kingdom .
2133649  7/1984  United Kingdom .

Primary Examiner—Siegfried H. Grimm
Attorney, Agent, or Firm—Emmanuel J. Lobato

[57] ABSTRACT

In a waveguide oscillator, a Gunn diode or other negative-resistance oscillator device (2) has a resonant cap (3) for coupling to the waveguide (1), and a tuning varactor diode (11) is coupled by a probe (13) to the electromagnetic filed in the vicinity of the cap (3). In accordance with the invention, a mechanically simple, compact and cheap oscillator arrangement is obtained by integrating both the varactor diode (11) and the probe (13) in a circuit body (10) mounted in the waveguide (1), preferably in an area below the plane of the cap (3) so as to reduce perturbation of the filed. The probe is formed as a conductive track (13) on the circuit body (10), for example as a transmission line coupling to the electric field and preferably located at the front surface (18) of the body (10) or as a current loop extending on a side wall of the body (10) and coupling to the magnetic field.

12 Claims, 2 Drawing Sheets

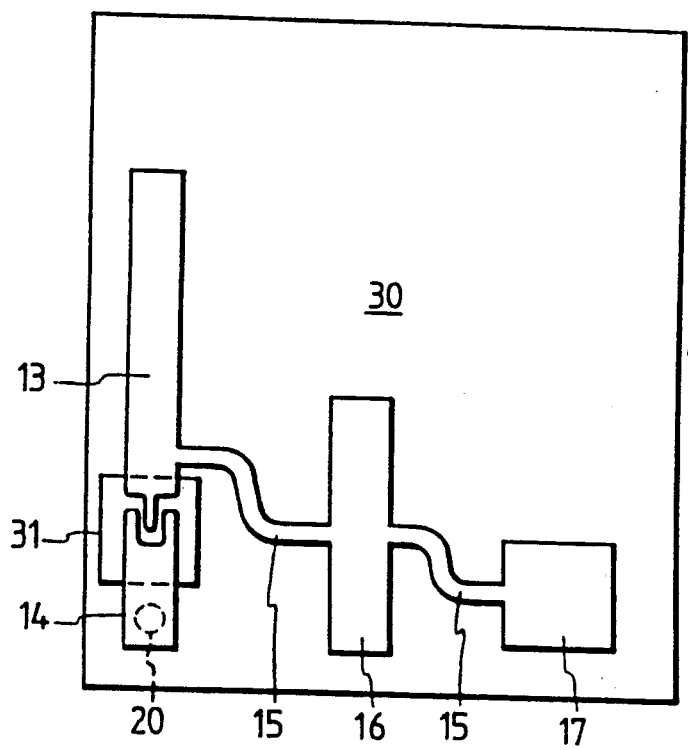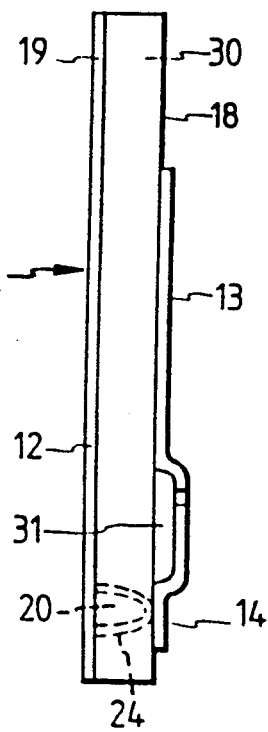
FIG.3.   FIG.4.
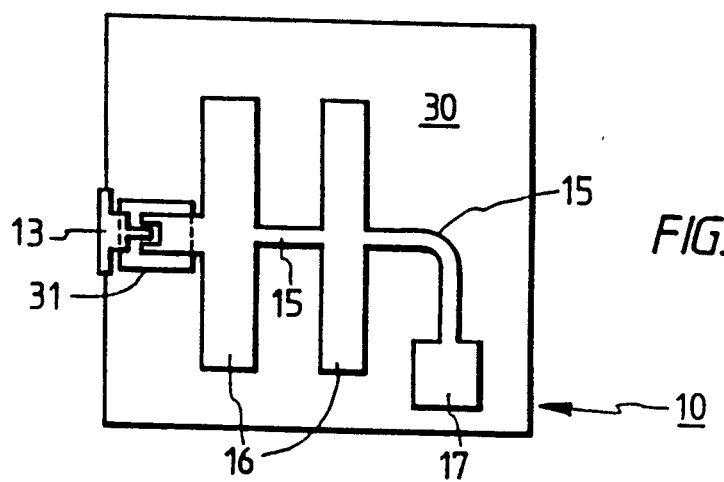
FIG.5.
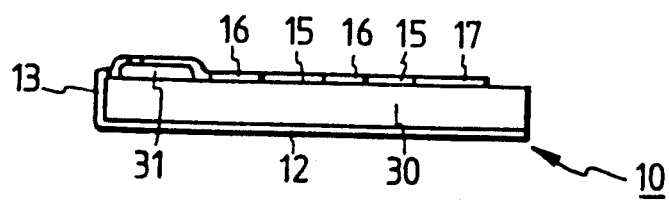
FIG.6.

WAVEGUIDE OSCILLATOR TUNABLE THROUGH INTEGRATED VARACTOR DIODE AND COUPLING PROBE

This invention relates to tunable waveguide oscillators comprising a negative-resistance oscillator device (for example, a Gunn device or an IMPATT device) on a waveguide, and having variable reactance means comprising a varactor diode coupled to the oscillator device to permit electronic tuning of the operating frequency of the oscillator. The invention relates particularly, but not exclusively, to waveguide oscillators for generating microwave energy at millimeter wavelengths, for example second-harmonic oscillators at frequencies above 60 GHz.

Published European patent application EP-A-0 114 437 and corresponding U.S. Pat. No. 4,568,890 disclose particular forms of tunable waveguide oscillators, in which the oscillator device has a resonant cap for coupling to the waveguide, and the variable reactance means has an electric probe which is orientated so as to couple to the electromagnetic field in the vicinity of the cap. By means of the probe in these known oscillators, microwave energy is coupled into the waveguide from outside. In particular, FIG. 5 of EP-A-0 114 437 shows a second-harmonic oscillator in which the probe couples to an external varactor-tuned cavity resonant at the fundamental frequency of the oscillator device. The probe is a central conductor of a coaxial transmission line passing through a side wall of the second-harmonic waveguide in which the oscillator device is mounted. The external-coupled arrangements disclosed in EP-A-0 114 437 permit satisfactory electronic tuning of the oscillators with good microwave performance at millimeter wavelengths, but the arrangements can occupy a significant volume, are mechanically complicated and difficult to set up. Both the expenditure in the time needed for the assembly and the expense of the external cavity and other components add to the cost of the oscillator.

The present invention is based on a recognition by the present inventor of these disadvantages of the known oscillator arrangements, and that a mechanically simpler, compact, easy to assemble and comparatively cheap oscillator arrangement can be obtained by integrating the variable reactance means (including its coupling probe) in a circuit body mounted in the waveguide, and furthermore that it is then possible also to include other circuitry (in addition to the varactor and its coupling probe) in the circuit body to improve the tuning characteristics.

According to the present invention, there is provided a tunable waveguide oscillator comprising a negative-resistance oscillator device in a waveguide, and variable reactance means comprising a varactor diode coupled to the oscillator device to permit electronic tuning of the operating frequency of the oscillator, the oscillator device having a resonant cap for coupling to the waveguide and the reactance means having an electric probe which is orientated so as to couple to the electromagnetic field in the vicinity of the cap, the oscillator being characterised in that the reactance means comprising both the varactor diode and the probe is integrated in a circuit body mounted in the waveguide, and in that the probe is formed by an electrically conductive track on the circuit body, which track is separated from the resonant cap by a gap inside the waveguide, at which gap the track is coupled to the electromagnetic field in the waveguide.

It is known from published European patent application EP-A-0 284 485 to assemble a plurality of components on the resonant cap of an oscillator device so as to provide an electronic tuning circuit in a waveguide. Thus, EP-A-0 284 485 discloses mounting a chip capacitor on top of the cap and coupling a beam-lead varactor diode in parallel by securing one beam lead of the varactor to the top plate of the capacitor and securing the other beam lead to an earthing pillar at one side of the oscillator device. In that manner the varactor diode is suspended in the waveguide. Wire connections from opposite sides of the waveguide are made to the top of the resonant cap and to the top plate of the chip capacitor on the cap.

By contrast, the present invention provides an integration of the tuning circuit in a circuit body which the present applicants consider can be easier, cheaper, and more robust to mount in the waveguide than the multiple level assembly of the plurality of components disclosed in EP-A-0 284 485. In accordance with the present invention, the coupling of the tuning circuit is to the electromagnetic field at a gap inside the waveguide, and the degree of the coupling can be controlled by appropriately designing the dimensions of the gap and of the track forming the coupling probe. Furthermore, the applicants consider that by having the various components integrated in a circuit body, the inclusion of the tuning circuit in the waveguide can have less effect in irregularly perturbing the electromagnetic field over that section of the waveguide than may be the case when different component bodies and their interconnections are assembled on top of the resonant cap. This reduction in perturbation can apply to the mounting of the circuit body in the waveguide. Thus, both the oscillator device and circuit body may be mounted adjacent to one wall of the waveguide (which can facilitate the precise determination of the dimensions of the gap, especially if both the oscillator device and circuit body are mounted on a common base member), and preferably the circuit body is then located in an area below the plane of the cap so as to extend no further inside the waveguide than does the cap of the oscillator device thereby reducing the field perturbation.

The track forming the probe may be present at a front major surface of the circuit body and its orientation on the front major surface may be such as to couple (at least primarily) to the electric component of the field in the gap. However the probe may be designed to couple (at least primarily) to the magnetic component of the field in the gap. Thus, for example, the track forming the probe may extend longitudinally over a side wall of (or in) the circuit body (between the front and back major surfaces) to form a current loop coupling to the magnetic field.

The circuit body may have a ground plane formed by metallization at its back major surface, and so its connection in the waveguide circuit can be formed as part of the mounting of the circuit body in the waveguide. Such a circuit body can be formed using known microstrip technology, and the varactor diode can be integrated between this back ground plane and the track forming the probe. However, other microwave monolithic intergrated circuit technologies may be used in forming the circuit body, for example coplanar transmission line technology having the varactor integrated between the track forming the probe and one or more ground plane strips which are also present at the front major surface of the circuit body.

The varactor diode may be formed in an active semiconductor region (for example, of semiconducting gallium arsenide) which is located at the front major surface of the circuit body and which is laterally bounded (to at least one side) by dielectric material (for example, semi-insulating gallium arsenide), on a part of which dielectric material the track forming the probe is located. Thus, known microwave monolithic integrated circuit technologies may be used to integrate the varactor diode and the probe. The active region can be formed particularly easily as a mesa of the semiconducting material on part of the front major surface of a substrate of the dielectric material. These and other features in accordance with the present invention are illustrated, by way of example, in an embodiment of the present invention now to be described with reference to the accompanying diagrammatic drawings. In these drawings:

FIG. 3 is a plan view and FIG. 4 is a side view of a tuning circuit body which may be used in the oscillator of FIGS. 1 and 2;

Figure 1:
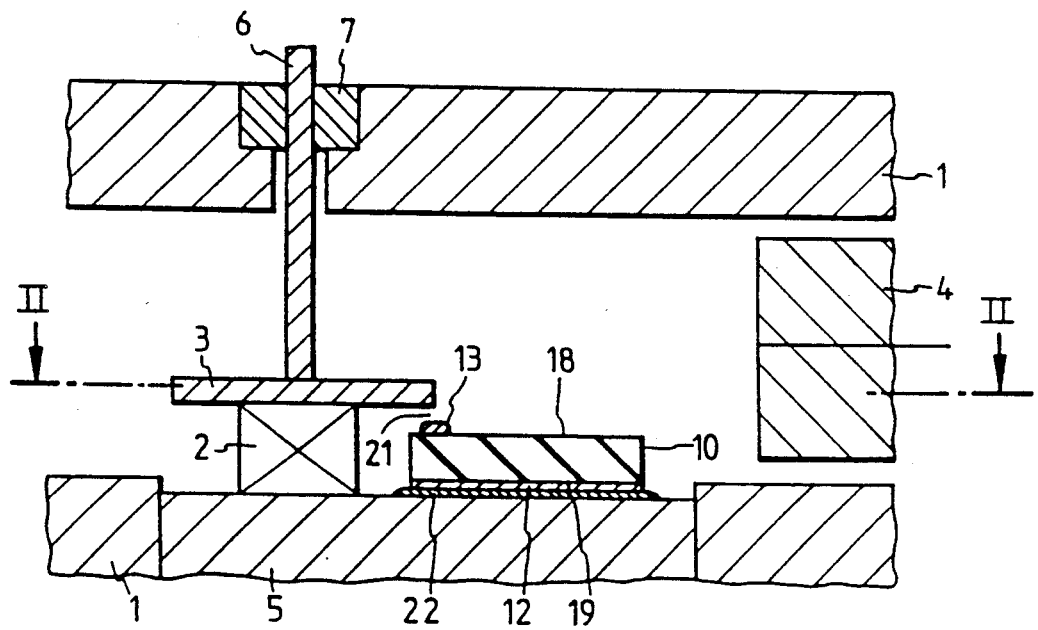
FIG. 1 is a transverse sectional view and FIG. 2 is a longitudinal sectional view of a tunable waveguide oscillator in accordance with the invention, the cross-section in FIG. 1 being taken on the line I—I in FIG. 2, and the cross-section of FIG. 2 being taken on the line II—II in FIG. 1.
Figure 2:
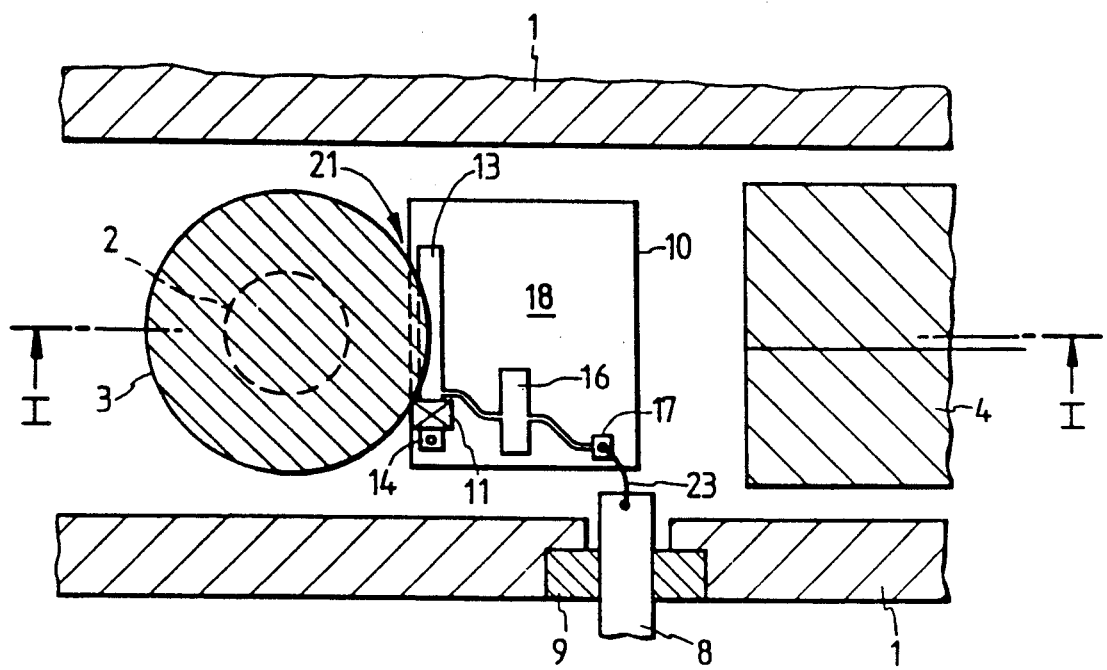

FIG. 5 is a plan view and FIG. 6 is a side view of another tuning circuit body which may be used in the oscillator of FIGS. 1 and 2. It should be noted that the drawings are diagrammatic and are not drawn to scale, the relative dimensions and proportions of various features being either exaggerated or reduced in size, for clarity and convenience in the drawings. Reference signs of one embodiment are also used to denote similar or corresponding parts of another embodiment.

The oscillator of FIGS. 1 and 2 comprises a negative-resistance oscillator device 2 (for example, a Gunn diode) in a waveguide 1, and a variable reactance means comprising a varactor diode 11 coupled to the oscillator device 2 to permit electronic tuning of the operating frequency of the oscillator. The oscillator device 2 has a resonant cap 3 for coupling to the waveguide 1. The reactance means has an electric probe 13 which is orientated so as to couple to the electromagnetic field in the vicinity of the cap 3.

In accordance with the present invention, the reactance means comprising both the varactor diode 11 and the probe 13 is integrated in a circuit body 10. The circuit body 10 has front and back major surfaces 18 and 19 respectively, and is mounted in the waveguide 1 via its back major surface in the arrangement shown in FIG. 1. The probe is formed by an electrically conductive track 13 on the circuit body 10. This track 13 is separated from the resonant cap 3 by a gap 21 inside the waveguide 1, at which gap 21 the probe 13 is coupled to the electromagnet field in the waveguide 1. The oscillator may be, for example, of the second harmonic type, similar to the oscillator disclosed in EP-A-0 114 437 but with the circuit body 10 inside the waveguide 1 replacing a varactor-tuned resonant cavity outside the waveguide. Thus, in this particular example, the waveguide 1 may be of standard rectangular cross-section terminated at one end by a movable non-contacting short-circuit termination 4. The waveguide 1 is of a cross-section suitable for progating millmeter wavelengths but (in this particular example) its cut-off frequency is above the fundamental frequency of oscillation of the Gunn diode 2. When a suitable bias voltage is applied to the Gunn diode 2 via its connections 5 and 6, the diode 2 generates microwave energy both at a fundamental frequency f and at a second harmonic frequency 2f (and possibly also at higher harmonic frequencies). The values of these frequencies are mainly dependent on the dimensions of the circular disc forming the resonant cap 3. This cap 3 effectively forms a radial transmission line with the waveguide wall. The position of the termination 4 has little effect on the values of the frequencies, but it defines the direction of propagation along the waveguide 1 and is adjustable to optimise the power output at 2f.

The Gunn diode 2 of standard encapsulation is mounted in known manner in a central longitudinal plane of the waveguide 1, on an electrically conductive heat-sink 5 accomodated in a bore in the bottom broad wall of the waveguide 1. The height of the cap 3 above the bottom wall of the waveguide 1 determines the degree of coupling of Gunn diode 2 into the waveguide 1, and this may be adjusted in known manner by adjusting the position of the heat-sink 5 along the bore in the waveguide wall. This heat-sink 5 constitutes an earth connection of the diode 2 to the wall of the waveguide 1. The diode 2 is coupled to a DC bias supply by means of the resonant cap 3 and a post 6 which extends to an RF choke 7 mounted in a bore in the upper broad wall of the waveguide 1. The choke 7 in this particular example is designed to have a cut-off frequency below the fundamental frequency f of oscillation of the diode 2.

Both the Gunn diode 2 and the tuning circuit body 10 are mounted adjacent to the bottom broad wall of the waveguide 1, and both are mounted on the heat-sink 5 in the particular example illustrated in FIG. 1. The circuit body 10 is located in an area below the plane of the cap 3 (corresponding to the line II—II in FIG. 1) so as to extend no further inside the waveguide 1 than does the cap of the Gunn diode 2. The arrangement of the body 10 and cap 3 is the easiest mounting arrangement to adopt with typical dimensions for the different component parts, it facilitates coupling of the probe 13 to the cap in a precisely designed manner, and it can also reduce perturbation of the electromagnetic field in the waveguide 1 due to the inclusion of the tuning circuit therein. However, mounting arrangements may be adopted in which the circuit body 10 or at least the connections to the body 10 are not below the level of the cap 3. The circuit body 10 is shown located between the oscillator device 2 and the termination 4, and this arrangement seems preferable in that it does not perturb the electromagnetic field out of the waveguide, in the direction of the load. However, other arrangements may be adopted in which the circuit body 10 is located on the opposite side of the oscillator device 2 from the termination 4.

As illustrated in FIG. 1 and 2, the electrical connections 5,22 and 8,23 to the circuit body 10 may also be located (at least for the most part) in the area blow the plane II—II of the cap 3. Thus, a ground plane 12 formed by metallization at the back surface 19 of the circuit body 10 is directly connected by a conductive bonding layer 22 to the mount 5 in the bottom wall of the waveguide 1. A bias connection 8,23 to the circuit body 10 is formed through a side wall of the waveguide 1. As illustrated in FIG. 2, this connection may comprise a transverse pin 8 in an RF choke 9 in the side wall (for example at a level below the plane II—II of the resonant cap 3) and a wire connection 23 between the pin 8 and a bias contact area 17 of the body 10.

The varactor diode 11 (appropriately biased via the connections 5,22 andd 8,23) is intergrated between the ground plane 12 and the probe 13 so that its variable capacitance becomes part of the tuning circuit of the oscillator. In the particular form illustrated in FIGS. 2 to 4, the tuning circuit in the body 10 is integrated in so-called "microstrip" technology on a dielectric substrate 30, with the back surface 19 metallized to form the ground-plane and with the various components defined by metallization areas 13 to 17 (for example, of gold) at the front surface 18. The track forming the probe 13 is present at the front surface 18 as part of an integrated transmission line connected at one end to one electrode of the varactor diode 11. The other electrode of the varactor diode 11 is connected to a metallization area 14 forming a ground return connection. Metallization areas 15 and 16 form RF filter components between the bias contact 17 and the probe track 13. These components 15 and 16 may be, for example, high and low impedence transmission lines (or inductors and capacitors) and serve to decouple the RF signal from the bias voltage applied to the contact 17.

The ground plane 12 is connected to the ground connection 14 of the diode 11 by metallization 24 in a small via hole 20 extending through the circuit body 10 from the back surface 19 to the front surface 18. The metalization 24 (for example, of gold) may coat the walls of the hole 20 or may, for example, fill the hole 20. In the form illustrated in FIG. 4, the active region for the varactor diode 11 is, for example, a mesa 31 of semi-conducting gallium, arsenide on part of the front major surface 18 of the dielectric substrate 30 which is of, for example, semi-insulating gallium arsenide. Gallium arsenide mesa technology is well established and reliably reproducible, both for planar varactors and for monolithic microwave integrated circuits. The mesa 31 is formed from an epitaxial layer on the semi-insulating substrate 30. A p-n diode junction is formed in the mesa 31 by localized dopant introduction, and the p and n type regions of the varactor diode are contacted at the top of the mesa 31 by electrode fingers via windows in an insulating layer. The insulating layer covers the sides and top of the gallium arsenide mesa 31, except at the windows on the top of the mesa 31.

By using a material of high dielectric constant (such as galluim arsenide with a value of 12.9 ) for the circuit substrate 30, the scale at which the tuning circuit body 10 is of a compact small size, easily incorporated into the waveguide 1 in close proximity to the oscillator device 2 and resonant cap 3, and between the device 2 and the termination 4. This high scale intergration readily permits the inclusion of other circuitry in the body 10 (in addition to the probe 13 and varactor diode), for example capacitive and inductive elements in the form of transmission lines to give a desired tuning behaviour. Such an additional transmission line may be included between, for example, the probe track 13 and the varactor diode 11 to modify the electrical characteristics presents to the oscillator device 2 by varactor 11. By including such addtional circuitry, the tuning characteristic of the varactor 11 (in conjunction with the device 2 and cap 3) can be adjusted to give a best response, for example with regard to range of tuning and linearity; and this response can be more easily reproduced because the additional circuitry forms part of the circuit body 10.

Such a circuit body can be located easily below the plane II—II of the cap 3. Thus, typical dimensions are, for example, a height of about 0.4 mm for an encapsulated Gunn diode 2, and about 0.25 mm for the thickness of the dielectric substrate 30 of the circuit body 10, whereas the height of the waveguide 1 may be, for example 1.27 mm. The thickness of the cap 3 may be, for example, about 0.1 mm.

The tuning circuit couples to the resonant cap 3 by means of the probe 13 in close proximity to the cap 3. In the arrangement illustrated in FIGS. 1 and 2, the track 13 forming the probe extends longitudinally in a plane parallel to (or in, if so desired) the plane II—II of the cap 3 and in a direction parallel to (or in, if so desired) a plane tangential to the radial surface of the cap 3. The radial surface of the cap 3 extends parallel to the broad walls of the waveguide 1, and the tangential plane is transverse to both the broad and narrow walls of the waveguide 1. This arrangement provides good coupling to the electromagnetic field in the proximity of the cap 3. The strength of the coupling can be varied by adjusting several parameters, for example by lengthening the track 13, and/or by reducing the lateral spacing between the track 13 and cap 3 (by moving the body 10 sideways on the mount 5) and/or by reducing the vertical spacing between the track 13 and the cap 3 (by using separate mounts for the device 2 and body 10, or by using a mount 5 having mounting area at different levels for the device 2 and body 10, and/or by adjusting the height at which the cap 3 is mounted on the device 2). This transmission line probe 13 on the body 10 couples primarily to the electric field component of the electromagnetic field in the waveguide 1, in the vicinity of the cap 3. It appears to function in a similar manner to the probe in the second-harmonic waveguide oscillator of EP-A-0 114 437, except that in the oscillator of FIGS. 1 and 2 the probe 13 does not couple microwave energy into the waveguide 1 but simply connects the varactor into the tuning circuit of the oscillator.

A transmission line probe 13 coupling to the electric field is most easily intergrated on the front major surface 18 of the body 10, as illustrated in FIGS. 1 to 4. However, it is possible (but less convenient) to provide a track 13 extending longitudinally along a side wall of the body 10 (adjacent to the cap 3) to form the probe for coupling at least primarily to the electric field in the gap 21. FIGS. 5 and 6 illustrate another probe arrangement on a circuit body 10 in accordance with the invention. In this embodiment, the track 13 forms a current loop between the varactor diode 11 and a ground plane 12 so as to couple (at least primarily) to the magnetic field in the gap 21. In the form illustrated in FIGS. 5 and 6, this track 13 forming the probe extends longitudinally on a side wall of the body 10, from the front surface 18 to the back surface 19 in a direction perpendicular to the plane II—II of the resonant cap 3. In this body 10, no additional via hole 20 is required for the RF ground return connection to the varactor diode 11. Thus, the current-loop track 13 is connected to one electrode of the varactor diode 11 whose other electrode is connected via the components 15 and 16 to the bias contact 17. However, if desired, the track 13 forming the current loop may extend on the side wall(s) of a via hole in the body 10, instead of on the side wall of the body 10. The body 10 of FIGS. 5 and 6 may be mounted in the same general area of the waveguide 1 as in FIGS. 1 and 2, with its side wall which bears the track 13 being positioned in close proximity to the resonant cap 3. The orientation of the current-loop track 13 is therefore parallel to the Gunn diode 2.

It will be evident that many modifications are possible within the scope of the invention. Thus, for example, instead of microstrip, the tuning circuit can be integrated in the circuit body 10 using other monolithic microwave intergrated circuit technologies, for example co-planar transmission line technology. Instead of forming an RF ground return connection using the via hole 20 and an intimate contact between the back face 19 of the body 10 and the bottom wall mount 5 of the waveguide 1, this RF ground return connection may be made in other ways, for example by use of a suitable open-circuit quarter-wave stub at the upper face 18 of the body 10 or an upper ground plane on the face 18. Instead of the DC bias connection to the varactor diode 11 of FIGS. 3 and 4 being made between the probe 13 and the diode 11, this connection may be to the opposite side of the diode 11, and the RF ground connection may be made between the probe 13 and the diode 11. Instead of using a vertical post 6 to form the connection to the cap 3 and upper terminal of the Gunn diode 2, a transverse pin in a side wall of the waveguide 1 may be used, together with a wire connection, similar to the arrangement of parts 8 and 9 in FIG. 2. Although a second-harmonic oscillator has been described with reference to FIGS. 1 and 2, a waveguide oscillator in accordance with the invention may be designed for use at the fundamental frequency of oscillation of the device 2. Furthermore, although reference has been made to a Gunn diode, other types of negative-resistance oscillator devices 2 may be used, for example an IMPATT diode. It is particularly convenient for manufacture and leads to easily reproducible characteristics, to mount the circuit body 10 and oscillator device 2 and cap 3 adjacent to the same one wall of the waveguide 1. However the body 10 could be mounted on a post extending from the top wall of the waveguide 1, towards the device 2 and cap 3 mounted adjacent to the bottom wall. Although the oscillator described with reference to FIGS. 1 and 2 comprises a waveguide along which the microwaves are propagated in one direction, oscillators in accordance with the present invention may instead comprise a resonant waveguide cavity (for example a co-axial resonator cavity) with no wave propagation and from which the output may be extracted by, for example, a probe or a slot in the cavity.

The reading the present disclosure, other modifications will be apparent to persons skilled in the art. Such modifications may involve other features which are already known in the design, manufacture and use of microwave circuits and oscillator systems, and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not in mitigates any or all of the same technical problems as does the present invention. The applications hereby give notice that new claims may be formulated to such features and/or combinations of such features during the prosecution of the present application or of any further application derived therefrom.

I claim:

1. A tunable waveguide oscillator comprising a negative-resistance oscillator device in a waveguide, and variable reactance means comprising a varactor diode coupled to the oscillator device to permit electronic tuning of the operating frequency of the oscillator, the oscillator device having a resonant cap for coupling to the waveguide, and the reactance means having an electric probe which is orientated so as to couple to the electromagnetic field in the vicinity of the cap, characterised in that the reactance means comprising both the varactor diode and the probe is integrated in a circuit body mounted in the waveguide, and in that the probe is formed by an electrically conductive track on the circuit body, which track is separated from the resonant cap by a gap inside the waveguide, at which gap the track is coupled to the electromagnetic field in the waveguide.

2. An oscillator as claimed in claim 1, further characterised in that both the oscillator device and circuit body are mounted adjacent to one wall of the waveguide, and the circuit body is located in an area below the plane of the cap so as to extend no further inside the waveguide than does the cap of the oscillator device.

3. An oscillator as claimed in claim 1, further characterised in that the circuit body has front and back major surfaces and is mounted in the waveguide via its back major surface, a ground plane is formed by metallization at said back major surface, and the varactor diode is present at the front major surface.

4. An oscillator as claimed in claim 3, further characterised in that the ground plane is connected to the varactor diode by metallization in a via hole extending through the circuit body from the back to the front major surface.

5. An oscillator as claimed in claim 1, further characterised in that the circuit body also comprises filter components between a bias contact and the track forming the probe, so as to decouple the RF signal from a bias voltage applied to the bias contact.

6. An oscillator as claimed in claim 1, further characterised in that the varactor diode is formed in an active semiconductor region which is located at a front major surface of the circuit body and which is laterally bounded (to at least one side) by dielectric material, on a part of which dielectric material the track forming the probe is located.

7. An oscillator as claimed in claim 6, further characterised in that the dielectric material is a substrate of semi-insulating gallium arsenide, and the active region is a mesa of semiconducting gallium arsenide on part of the front major surface of the substrate.

8. An oscillator as claimed in claims 1, further characterised in that the track is present at a front major surface of the circuit body as part of an intergrated transmission line for coupling primarily to the electric field in the gap.

9. An oscillator as claimed in claim 8, further characterised in that the track forming the probe extends longitudinally in a plane parallel to (or in) the plane of the cap and in a direction parallel to (or in) a plane tangential to a radial surface of the cap.

10. An oscillator as claimed in claim 1, further characterised in that the track forms current loop between the varactor diode and a ground plane of the body, which current loop couples primarily to the magnetic field in the gap.

11. An oscillator as claimed in claim 10, further characterised in that the track forming the probe extends on a side wall of (or in) the body in a direction perpendicular to the plane of the resonant cap.

12. An oscillator as claimed in claim 2, further characterized in that the circuit body has front and back major surface and is mounted in the waveguide via its back major surface, a ground plane is formed by metallization at said back major surface, and the varactor diode is present at the front major surface.

* * * * *